United States Patent
Cho et al.

(10) Patent No.: US 8,547,471 B2
(45) Date of Patent: Oct. 1, 2013

(54) CAMERA MODULE AND METHOD OF MANUFACTURING THE CAMERA MODULE

(75) Inventors: Yong-Hoe Cho, Bucheon-si (KR); Byoung-Rim Seo, Hwaseong-si (KR); Yung-Cheol Kong, Cheonan-si (KR); Han-Sung Ryu, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 288 days.

(21) Appl. No.: 13/044,601

(22) Filed: Mar. 10, 2011

(65) Prior Publication Data
US 2011/0285889 A1 Nov. 24, 2011

(30) Foreign Application Priority Data
May 18, 2010 (KR) .................. 10-2010-0046324

(51) Int. Cl.
*H04N 5/225* (2006.01)
*H01L 31/0203* (2006.01)

(52) U.S. Cl.
USPC ........................ 348/340; 348/373; 257/433

(58) Field of Classification Search
USPC ...... 348/340, 373; 250/208.1; 257/203–204, 257/210–211, 343, 432, 433
See application file for complete search history.

(56) References Cited

U.S. PATENT DOCUMENTS

| 2003/0164891 | A1* | 9/2003 | Akimoto | 348/340 |
| 2009/0115891 | A1* | 5/2009 | Ryu et al. | 348/374 |
| 2009/0194668 | A1* | 8/2009 | Kong | 250/201.2 |
| 2009/0256931 | A1* | 10/2009 | Lee et al. | 348/231.99 |
| 2010/0141825 | A1* | 6/2010 | Kim et al. | 348/340 |

FOREIGN PATENT DOCUMENTS

| KR | 1020060085435 A | 7/2006 |
| KR | 100863800 B1 | 10/2008 |
| KR | 1020090044768 | 5/2009 |

* cited by examiner

*Primary Examiner* — Kelly L Jerabek
(74) *Attorney, Agent, or Firm* — Volentine & Whitt, PLLC

(57) ABSTRACT

A camera module includes an image sensor chip including a substrate having first and second opposite surfaces and a ground pad on the first surface, a housing surrounding the sides of the image sensor chip but which leaves the second surface of the image sensor chip exposed, an electromagnetic wave-shielding film united with the housing, and an electrical conductor electrically connected to the ground pad. The camera module also has an optical unit disposed on the first surface of the image sensor chip in the housing to guide light from an object to the image sensor chip. The electrical conductor extends through a side of the housing. The conductor also contacts the electromagnetic wave-shielding film to electrically connect the ground pad and the electromagnetic wave-shielding film.

14 Claims, 5 Drawing Sheets

CAMERA MODULE AND METHOD OF MANUFACTURING THE CAMERA MODULE

PRIORITY STATEMENT

This application claims priority under 35 U.S.C. §119 to Korean Patent Application No. 2010-0046324, filed on May 18, 2010 in the Korean Intellectual Property Office (KIPO).

BACKGROUND

1. Field

The inventive concept relates to a camera module having an image sensor chip and to a method of manufacturing such a camera module.

2. Description of the Related Art

Recently, high resolution camera modules have been widely used in digital devices such as digital cameras, camera phones, etc. The camera module includes an image sensor for converting image information into electrical information. To this end, the image sensor includes semiconductor devices capable of converting photons to electrons. Examples of the image sensor are charge coupled devices (CCD) and complementary metal oxide silicon (CMOS) image sensors (CIS). Because the digital device includes various semiconductor devices, the digital device is susceptible to electromagnetic interference.

SUMMARY

According to an aspect of the inventive concept, there is provided camera module comprising an image sensor chip, a housing extending around the sides of the image sensor chip, an electromagnetic wave-shielding film united with the housing, an optical unit disposed in the housing, and an electrical conductor extending through a side of the housing. The image sensor chip includes a substrate having first and second opposite surfaces, and a ground pad on the first surface. The first surface of the substrate of the image sensor chip, i.e., the surface bearing the ground pad, faces the interior of the housing and the second surface is exposed to the environment outside the housing. The optical axis of the optical unit intersects the image sensor chip so that light propagating along the axis, e.g., focused by the optical unit, is incident on the active region of the image sensor chip. The electrical conductor that extends through a side of the housing electrically connects the ground pad and the electromagnetic wave-shielding film.

According to another aspect of the inventive concept, there is provided a camera module comprising a housing, and a chip surrounded by the housing and comprising a substrate having a first surface facing the interior of the housing and a second surface exposed to the environment outside the housing, an image sensor exposed at the first surface of the substrate and comprising electronic circuitry, and pads of electrically conductive material disposed on the first surface of the substrate, wherein the pads are connected to the circuitry of the image sensor and include a pad for grounding the chip disposed on the first surface of the substrate of the chip. Furthermore, an optical unit for directing light onto an image sensor of the chip is contained by the housing. In particular, the optical axis of the optical unit intersects that part of the image sensor which is exposed at the first surface of the substrate of the chip. Thus, light propagating along the optical axis impinges the image sensor. The camera module also has an electrical conductor extending through a side wall of the housing and electrically connected to a ground pad of the chip.

According to still another aspect of the inventive concept, there is provided a method of manufacturing a camera module, comprising: providing an image sensor chip including a substrate and a ground pad on a first surface of the substrate, providing a housing having a through-hole extending through a side thereof, providing a transparent member, providing the housing with an electromagnetic wave-shielding film, assembling the image sensor chip and the transparent member to the housing, and forming an electrical conductor that is electrically connected to the ground pad of the image sensor chip. The image sensor chip, transparent member and housing are assembled to one another in such a sequence, etc., that the first surface of the substrate of the image sensor chip faces the interior of the housing, the transparent member is disposed on the first surface of the substrate, the second surface of the substrate of the image sensor chip is exposed to the environment outside the housing, and the ground pad is exposed to the environment outside the housing via the through-hole extending through the side of the housing. The through-hole is filled with conductive material to form the conductor.

BRIEF DESCRIPTION OF THE DRAWINGS

The inventive concept will be more clearly understood from the following detailed description of preferred embodiments thereof made in conjunction with the accompanying drawings.

DETAILED DESCRIPTION OF THE PREFERRED EMBODIMENTS

Figure 1:
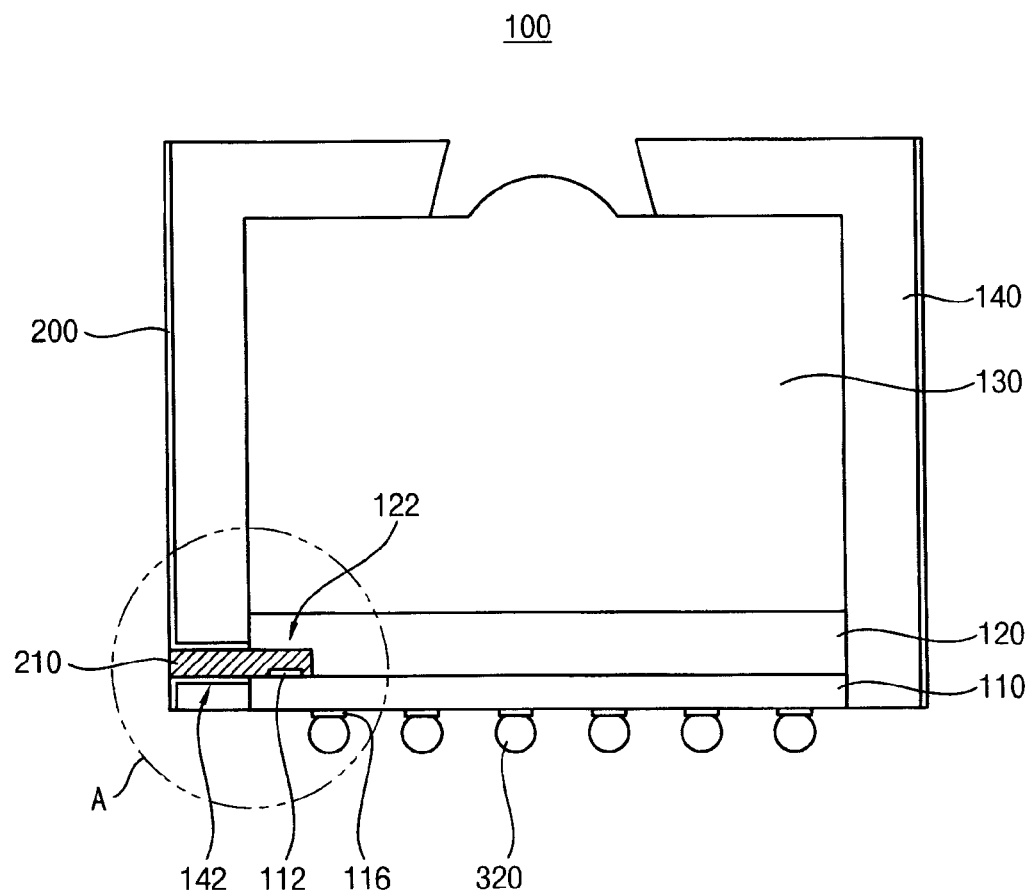
FIG. 1 is a cross-sectional view of an embodiment of a camera module in accordance with the inventive concept.

Various embodiments and examples of embodiments of the inventive concept will be described more fully hereinafter with reference to the accompanying drawings. In the drawings, the sizes and relative sizes and shapes of elements and layers may be exaggerated for clarity. In particular, the cross-sectional illustrations are schematic. Also, like numerals designate like elements throughout the drawings.

Furthermore, spatially relative terms, such as "side", are used to describe the orientation shown in the drawings for ease of description and are not necessarily limiting because embodiments according to the inventive concept can assume orientations different than those illustrated in the drawings when in use.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

Figure 2:
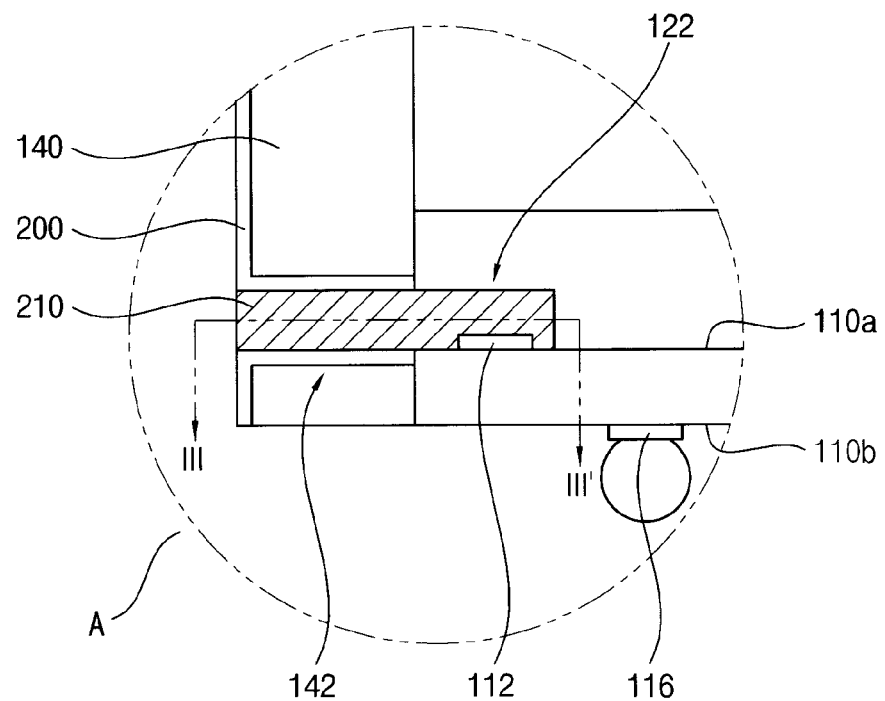
FIG. 2 is an enlarged view of portion "A" in FIG. 1 of the camera module.
Figure 3:
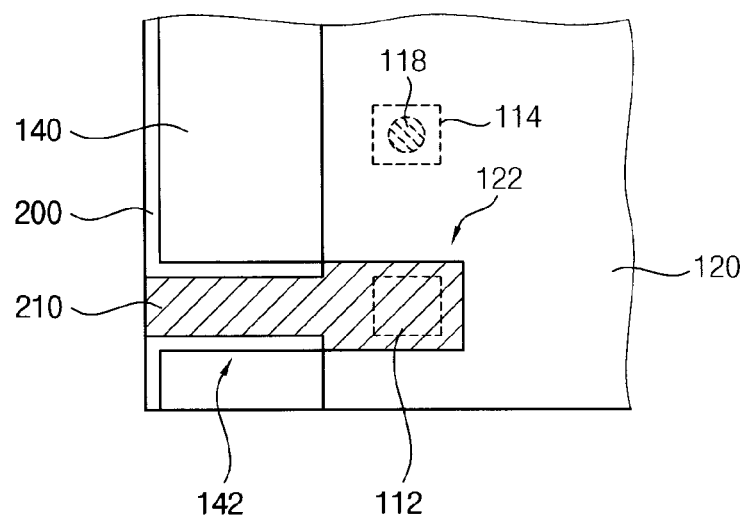
FIG. 3 is a cross-sectional view taken along line III-III' in FIG. 2.

An example of a camera module in accordance with the inventive concept will now be described with reference to FIGS. 1-3.

The camera module 100 includes an image sensor chip 110, an optical unit 130 provided on the image sensor chip 110 and a housing 140 containing the image sensor chip 110 and the optical unit 130.

In this example, the image sensor chip 110 includes a CMOS (complementary metal oxide silicon) image sensor. The CMOS image sensor (CIS) has an active pixel region for image pickup and a CMOS logic region for processing signals output from the active pixel region. The active pixel region may include a photodiode and a MOS transistor. The CMOS logic region may include a plurality of CMOS transistors.

An example of the general structure of the image sensor chip 110 will now be described. The image sensor chip 110 includes a substrate having a first surface 110a and a second surface 110b opposite to the first surface 110a. The first surface 110a is an active surface at which circuit elements of the image sensor chip are provided. A ground pad 112 and a plurality of chip pads 114 are also disposed on the first surface 110a on the image sensor chip 110. The pads are, for example, spaced along the periphery of the image sensor chip 110. The image sensor chip 110 also has outer connection pads 116 on the second surface 110b of the substrate.

In this example, the image sensor chip 110 has conductive vias (TSV) 118 extending through the substrate and electrically connecting the chip pads 114 to the outer connection pads 116. A plurality of outer connection members 320, such as solder balls, may be disposed on the outer connection pads 116. Accordingly, the image sensor chip 110 may be mounted on a circuit board (not illustrated) by means of the outer connection members 320.

In an example of this embodiment, the camera module 100 also has a transparent member 120 on the image sensor chip 110. The transparent member 120 serves as an optical filter. To this end, the transparent member 120 may be a layer of glass. The glass or other transparent material may be in the form of a sheet adhered to the image sensor chip 110 by an adhesive film.

The transparent member 120 may have a recess 122 in which the ground pad 112 of the image sensor chip 110 is received. Thus, in this case, the opening 122 is provided in the outer periphery of a lower surface of the transparent member 120 adjacent the outer periphery of the image sensor chip 110. In particular, the recess 122 may form a step in the outer periphery of the transparent member 120. The recess 122 of the transparent member 120 is in open communication with a through-hole 142 of the housing 140 to provide a path along which the ground pad 112 can be connected to an external ground.

For example, the through-hole 142 extends through a side of the housing 140, and is contiguous with the recess 122 in the transparent member 120. To this end, at least part of the through-hole 142 is located at a level above the upper surface 110a of the substrate of the image sensor chip 110. Accordingly, the ground pad 112 of the image sensor chip 110 may be disposed along the path defined by the through-hole 142 and the recess 122.

The optical unit 130 is disposed on the image sensor chip 110. In this example, the optical unit 130 is disposed on the transparent member 120. The optical unit 130 includes at least one lens for guiding light from an object to the image sensor chip 110. Accordingly, the optical unit 130 focuses light from the object on the image sensor chip 110.

In this embodiment, the housing 140 surrounds the image sensor chip 110, the transparent member 120 and the optical unit 130. In this respect, the image sensor chip 110, the transparent member 120 and the optical unit 130 may together have the form of a pillar whose outer contour (or cross section) is square. In this case, the inner contour (cross section) of the housing 140 is square and complementary with respect to the outer contour of the pillar. Furthermore, the housing 140 exposes a light receiving portion of the optical unit 130 (a convex surface of a lens in the illustrated example) and the second surface 110b of the substrate of the image sensor chip 110. Accordingly, the outer connection pads 116 of the image sensor chip 110 are also exposed by the housing 140. Nonetheless, the housing 140 protects the relatively fragile components, such as the image sensor and optical elements from impacts that the module 100 may experience.

The camera module 100 may also include a shielding film 200 on the housing 140. The shielding film 200 may also extend along an inner surface of the housing 140 that defines the through-hole 142. The shielding film 200 is of material, known per se, that blocks electromagnetic waves. That is, shielding film 200 prevents the camera module 100 from experiencing electromagnetic interference.

As shown in the figures, the camera module 100 may also include conductive structure 210 occupying the through-hole 142 of the housing 140 and the recess 122 of the transparent member 120. In this case, the conductive structure 210 extends through the side of the housing 140 and covers the ground pad 112 of the image sensor chip 110 disposed on the first surface 110a. Thus, circuitry of the image sensor chip 110 can be readily grounded via the ground pad 112 and conductive structure 210. Furthermore, the conductive structure 210 may electrically connect the shielding film 200 to the ground pad 112.

In the embodiment of a camera module as described above, one of the conductive pads formed on the first surface 110 of the substrate of the image sensor chip 110 is dedicated for use as a ground pad. Thus, the ground pad 112 does not require a via in contrast to a conventional case in which the ground pad is formed on the exposed surface of the substrate. Therefore, the inventive concept allows for a freer design for the layout of the vias extending through the substrate of the image sensor chip. Also, the structure for allowing electronic circuitry of the image sensor chip to be grounded is relatively simple.

A method of manufacturing a camera module in accordance with the inventive concept will now be described with reference to FIGS. 4 to 8.

Figure 4:
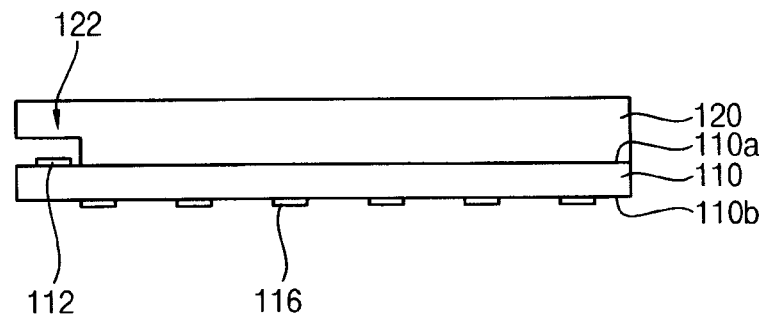
FIGS. 4 to 8 are cross-sectional views and together illustrate a method of manufacturing a camera module according to the inventive concept.

Referring first to FIG. 4, to an image sensor chip 110 is provided, and a transparent member 120 is adhered to the image sensor chip 110.

In an example of this process, first, dies are demarcated on a wafer by scribe lines, for example (not illustrated). The dies may be defined at regular intervals across the wafer. Each die has a ground pad and a plurality of chip pads on an active surface thereof. The dies are separated from one another by sawing the wafer (along the scribe lines), and then each respective die is processed to form/complete an image sensor chip.

A glass substrate may be adhered to the wafer before the sawing process is performed. At this time, the glass substrate has one or more recesses therein at a position(s) corresponding to (i.e., over) the ground pads of the image sensor chips to be formed. In this case, the recess(es) in the glass substrate are located along respective ones of the scribe lines. Thus, the glass substrate is sliced along with the wafer during the sawing process. The slicing of the glass substrate exposes the recess(es) along the cuts. As a result, the respective image sensor chips 110 are formed, each image sensor chip 110 has a transparent member 120 adhered thereto, and an outer peripheral edge portion of each transparent member 120 has a stepped shaped defining a recess that exposes a ground pad 112 of the chip 110 to which it is adhered.

As is also illustrated in FIG. 4, the image sensor chip 110 includes a substrate having a first surface 110a constituting an active surface of the chip where circuit elements of the image sensor chip are located. The ground pad 112 and a plurality of chip pads 114 (refer back to FIG. 3) are disposed on the first surface 110a. In the example of the image sensor chip 110 described above, respective ones of the pads, including the ground pads 112, are disposed along an outer peripheral portion of the image sensor chip 110. As was also mentioned above, the image sensor chip 110 may have outer connection pads 116 on a second surface 110b of the substrate of the chip 110, and conductive vias extending through the substrate and electrically connecting the chip pads 114 to the outer connection pads 116.

Figure 5:
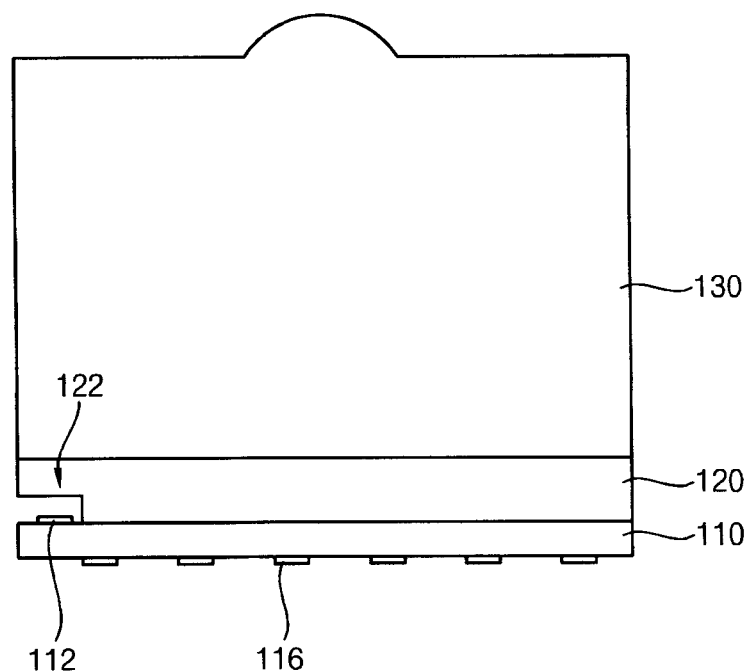

Referring to FIG. 5, an optical unit 130 is adhered to the transparent member 120. As was described above, the optical unit 130 may include at least one lens for guiding light from an object to the image sensor chip 110. Accordingly, the optical unit 130 may focus light from the object onto the image sensor chip 110.

Figure 6:
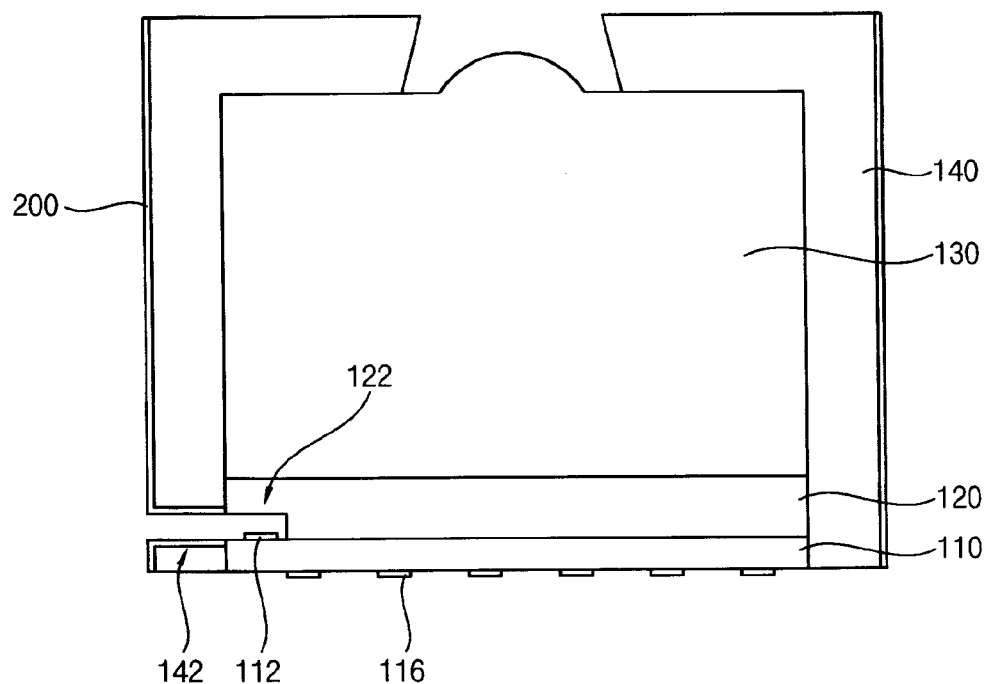

Referring to FIG. 6, the image sensor chip 110, the transparent member 120 and the optical unit 130 are accommodated in a housing 140 having a through-hole 142. At this time, the through-hole 142 is in open communication with and, more specifically, is aligned with the recess 122 in the transparent member 120. Accordingly, the ground pad 112 of the image sensor chip 110 is exposed by the through-hole 142 and the recess 122.

A shielding film 200 is formed on an outer surface of the housing 140 including the surface that defines the through-hole 142. The shielding film 200 shields the components within the housing 140 from electromagnetic radiation. In particular, the housing 140 and shielding film 200 thereon surround the image sensor chip 110 to prevent stray electromagnetic radiation from neighboring devices, for example, from interfering with the operation of the circuitry of the chip 110, i.e., to prevent the camera module from experiencing electromagnetic interference.

Figure 7:
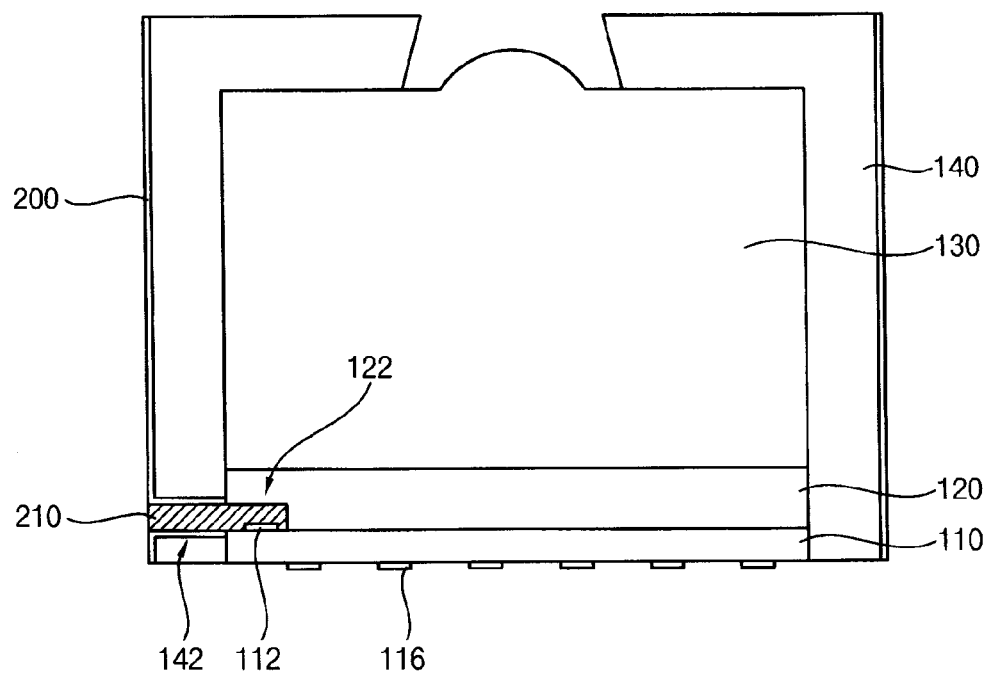

Referring to FIG. 7, the conductive structure 210 is formed to electrically connect the shielding film 200 and the ground pad 112 of the image sensor chip 110. In an example of this process, conductive material is dispensed into the through-hole 142 and the recess 122 to form the conductive structure 210. The conductive material may be solder paste or conductive epoxy resin.

Figure 8:
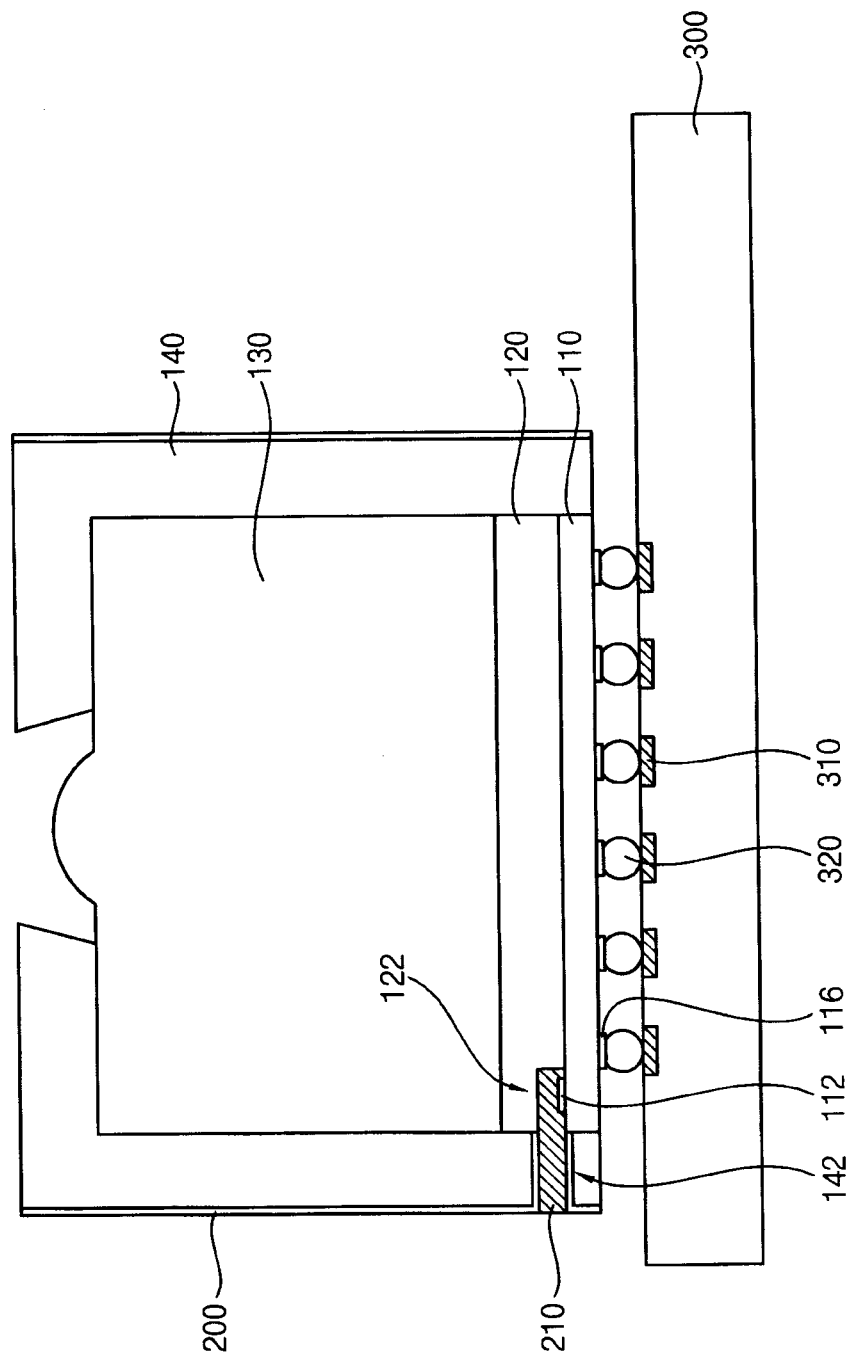

Referring to FIG. 8, outer connection members 320 such as solder balls are formed on the outer connection pads 116 and the image sensor chip 110. As is also shown in FIG. 8, the camera module so completed may be mounted to a circuit board 300. For example, the outer connection members 320 are disposed on and bonded to bonding pads 310 of the circuit board 300 to electrically connect the image sensor chip 110 and the circuit board 300.

As was described in detail above, a camera module in accordance with the inventive concept includes a housing surrounding an image sensor chip, and an electromagnetic wave-shielding film on an outer surface of the housing and surrounding (extending around the side of) the image sensor chip. Therefore, the image sensor chip is protected from external impact and electromagnetic interference between the camera module and an adjacent electronic device can be prevented.

In addition, a ground pad of the image sensor chip is formed on the same surface of the substrate of the image sensor chip as the chip pads. Therefore, a via is not required for the ground pad. Thus, it is economical to manufacture a camera module according to the inventive concept is.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A camera module, comprising:
an image sensor chip including a substrate having first and second opposite surfaces, and a ground pad on the first surface;
a housing extending around the sides of the image sensor chip, and wherein the first surface of the substrate bearing the ground pad faces the interior of the housing and the second surface is exposed to the environment outside the housing;
an electromagnetic wave-shielding film united with the housing;
an optical unit disposed in the housing and having an optical axis intersecting the image sensor chip;
an electrical conductor extending through a side of the housing and electrically connecting the ground pad and the electromagnetic wave-shielding film; and
a transparent member disposed on the first surface of the image sensor chip so as to cover the image sensor chip, and
wherein the transparent member has a recess into which the conductor extends and in which the conductor is connected to the ground pad.

2. A camera module, comprising:
an image sensor chip including a substrate having first and second opposite surfaces, and a ground pad on the first surface;
a housing extending around the sides of the image sensor chip, and wherein the first surface of the substrate bearing the ground pad faces the interior of the housing and the second surface is exposed to the environment outside the housing, and wherein the housing has a through-hole extending through a side thereof;
an electromagnetic wave-shielding film extending on a surface of the housing, which defines the through-hole, as united with the housing;
an optical unit disposed in the housing and having an optical axis intersecting the image sensor chip; and
an electrical conductor extending in said through-hole through the side of the housing and electrically connecting the ground pad and the electromagnetic wave-shielding film.

3. The camera module of claim 2, wherein the ground pad is disposed at an outer peripheral portion of the image sensor chip.

4. The camera module of claim 2, wherein the image sensor chip includes a plurality of chip pads on the first surface.

5. The camera module of claim 4, wherein the image sensor chip includes electrically conductive vias that extend through the substrate of the image sensor chip and are electrically connected to the chip pads.

6. The camera module of claim 5, wherein the image sensor chip includes a plurality of outer connection pads disposed on the second surface of the substrate and electrically connected to the vias.

7. The camera module of claim 2, wherein the image sensor chip includes an image sensor exposed at the first surface of the substrate and comprising electronic circuitry, and pads of electrically conductive material disposed on the first surface of the substrate, the pads connected to the circuitry of the image sensor and including the ground pad.

8. The camera module of claim 7, wherein the image sensor is a complementary metal oxide silicon (CMOS) image sensor comprising an active region of pixels and a logic device including a plurality of CMOS transistors that process signals output from the pixels.

9. The camera module of claim 7, further comprising an electromagnetic wave-shielding film united with the housing and circumscribing substantially the entirety of a region within the housing that contains the circuitry of the chip.

10. The camera module of claim 9, wherein the pads connected to the circuitry of the image sensor include chip pads, and the chip includes electrically conductive vias that extend through the substrate of the image sensor chip and are electrically connected to the chip pads.

11. The camera module of claim 10, wherein the conductor contacts the electromagnetic wave-shielding film.

12. The camera module of claim 7, wherein the pads connected to the circuitry of the image sensor include chip pads, and the chip includes electrically conductive vias that extend through the substrate of the image sensor chip and are electrically connected to the chip pads.

13. The camera module of claim 2, further comprising a transparent member disposed on the first surface of the image sensor chip so as to cover the image sensor chip.

14. The camera module of claim 2, wherein the ground pad is embedded in the conductor.

* * * * *